(12) United States Patent
Nakamura et al.

(10) Patent No.: US 7,928,688 B2
(45) Date of Patent: Apr. 19, 2011

(54) VEHICLE, POWER SUPPLY DEVICE OF VEHICLE, AND CURRENT DETECTION DEVICE

(75) Inventors: Makoto Nakamura, Okazaki (JP); Hichirosai Oyobe, Toyota (JP); Tsuyoshi Yano, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 467 days.

(21) Appl. No.: 11/990,999

(22) PCT Filed: Aug. 15, 2006

(86) PCT No.: PCT/JP2006/316288
§ 371 (c)(1),
(2), (4) Date: Feb. 26, 2008

(87) PCT Pub. No.: WO2007/029473
PCT Pub. Date: Mar. 15, 2007

(65) Prior Publication Data
US 2008/0303529 A1    Dec. 11, 2008

(30) Foreign Application Priority Data
Sep. 2, 2005   (JP) .................................. 2005-255296

(51) Int. Cl.
*H02J 7/14*       (2006.01)
*H02J 7/00*       (2006.01)
(52) U.S. Cl. ........................................ 320/104; 320/132
(58) Field of Classification Search .................. 320/104, 320/132
See application file for complete search history.

(56) References Cited

U.S. PATENT DOCUMENTS

| | | | | |
|---|---|---|---|---|
| 5,994,872 | A | * 11/1999 | Hall | ........................... 320/104 |
| 6,495,989 | B1 | 12/2002 | Eguchi | |
| 2004/0164705 | A1 | * 8/2004 | Taniguchi | ..................... 320/104 |

FOREIGN PATENT DOCUMENTS

| | | |
|---|---|---|
| JP | A 2000-270402 | 9/2000 |
| JP | A 2002-124226 | 4/2002 |
| JP | A 2003-23703 | 1/2003 |
| JP | A 2005-168259 | 6/2005 |

OTHER PUBLICATIONS

Oct. 2, 2009 Search Report issued in European Patent Office Application No. 06 78 2843.

* cited by examiner

*Primary Examiner* — Bot LeDynh
*Assistant Examiner* — M'Baye Diao
(74) *Attorney, Agent, or Firm* — Oliff & Berridge, PLC

(57) ABSTRACT

A vehicle comprises a battery, i.e. a power storage unit having a capacity different from a reference capacity, a current sensor for detecting a current inputted to the power storage unit or outputted therefrom and delivering the detection value by converting it depending on the ratio of the capacity of the power storage unit to the reference capacity, and a controller performing current integration by receiving the output from the current detecting section and judging charged state of the power storage unit. The current sensor preferably comprises a sensor for measuring a current flowing through wiring connected with the power storage unit, and a converting section for converting the sensor output depending on the ratio of the capacity of the power storage unit to the reference capacity. When the capacity of the power storage unit is equal to n times of the reference capacity, the converting section delivers the sensor output while multiplying by 1/n.

13 Claims, 6 Drawing Sheets

FIG.6

| CONTROL AT THE TIME OF CHARGE | VOLTAGE STEP-UP CONVERTER | | FIRST INVERTER | | SECOND INVERTER | |
|---|---|---|---|---|---|---|
| | Q1 | Q2 | Q11 | Q12 | Q21 | Q22 |
| VAC>0:(VM1>VM2) | ON | OFF | OFF OR SWITCHING | SWITCHING | OFF | ON |
| VAC<0:(VM1<VM2) | ON | OFF | OFF | ON | OFF OR SWITCHING | SWITCHING |

VEHICLE, POWER SUPPLY DEVICE OF VEHICLE, AND CURRENT DETECTION DEVICE

TECHNICAL FIELD

The present invention relates to a vehicle, a power supply device of the vehicle, and a current detection device.

BACKGROUND ART

Recently, an electric vehicle and a fuel cell vehicle each having a motor used for driving a wheel, a hybrid vehicle having a motor and an engine each used for driving a wheel, and the like receive attention as a vehicle giving consideration to environment.

Such a vehicle is equipped with a large-capacity secondary battery used for driving a motor. The vehicle runs while monitoring a state-of-charge (SOC) of the secondary battery. In a case where the vehicle is an electric vehicle, a control device thereof notifies a driver to charge a secondary battery if necessary. In a case where the vehicle is a hybrid vehicle, a control device thereof starts up an engine, actuates a generator, and charges a secondary battery.

For example, Japanese Patent Laying-Open No. 2003-23703 discloses a hybrid vehicle that runs while monitoring a SOC.

As one of conditions for making hybrid vehicles widely available, common parts and units are used for various vehicle types. Meanwhile, a large-capacity secondary battery improves a running distance at one refueling, but increases a weight of a vehicle. Hence, an optimal capacity of the secondary battery must be selected in view of an economic aspect.

However, the selection of this optimal capacity is difficult due to a change in social realities (e.g., a change in price of gasoline), use conditions of a vehicle (e.g., frequency and necessity of a long distance run), and the like. In a region where gasoline is available inconveniently or a region where commercial power is inexpensive, moreover, charge of a secondary battery at home is realizable in addition to refueling.

A technology of secondary batteries advances remarkably, and a capacitance value per volume or per weight is improved gradually. In order to realize an efficient hybrid vehicle, it is advantageous that such an improved secondary battery is adopted.

As described above, if various hybrid systems are designed in correspondence with a change in capacity of a battery, there arises a problem that man-hours for development of a vehicle becomes large.

DISCLOSURE OF THE INVENTION

An object of the present invention is to provide a vehicle that is equipped with a secondary battery having various capacities and is developed with reduced man-hours, a power supply device of the vehicle, and a current detection device for use in the power supply device.

In summary, the present invention provides a vehicle including a power storage device that has a capacity different from a reference capacity, a current detection unit that detects a current inputted to/outputted from the power storage device, converts the detected value in accordance with a ratio between the capacity of the power storage device and the reference capacity, and outputs a resultant, and a charge control device that receives the output from the current detection unit, performs a current integration, and determines a state-of-charge of the power storage device.

Preferably, the current detection unit includes a sensor that measures a current flowing through a wire connected to the power storage device, and a conversion unit that converts an output from the sensor in accordance with the ratio between the capacity of the power storage device and the reference capacity.

More preferably, when the capacity of the power storage device is n times as large as the reference capacity, the conversion unit multiplies the output from the sensor by 1/n, and then outputs a resultant.

Preferably, the vehicle further includes a connection part that connects, to the power storage device, a power line for external charge.

Preferably, the vehicle further includes a rotating electric machine that propels the vehicle with the use of power stored in the power storage device, and an internal combustion engine that propels the vehicle in cooperation with the rotating electric machine.

According to another aspect, the present invention provides a power supply device of a vehicle, including a power storage device that has a capacity different from a reference capacity, and a current detection unit that detects a current inputted to/outputted from the power storage device, converts the detected value in accordance with a ratio between the capacity of the power storage device and the reference capacity, and outputs a resultant. The current detection unit outputs the detected value to a charge control device that performs a current integration and determines a state-of-charge of the power storage device.

Preferably, the current detection unit includes a sensor that measures a current flowing through a wire connected to the power storage device, and a conversion unit that converts an output from the sensor in accordance with the ratio between the capacity of the power storage device and the reference capacity.

More preferably, when the capacity of the power storage device is n times as large as the reference capacity, the conversion unit multiplies the output from the sensor by 1/n, and then outputs a resultant.

Preferably, the power supply device further includes a connection part that connects, to the power storage device, a power line for external charge.

Preferably, the vehicle includes a rotating electric machine that propels the vehicle with the use of power stored in the power storage device, and an internal combustion engine that propels the vehicle in cooperation with the rotating electric machine.

According to still another aspect, the present invention provides a current detection device for use in a power supply device of a vehicle. The current detection device is connected between a power storage device that has a capacity different from a reference capacity and a charge control device. The current detection device detects a current inputted to/outputted from the power storage device, converts the detected value in accordance with a ratio between the capacity of the power storage device and the reference capacity, and outputs a resultant. The charge control device performs a current integration and determines a state-of-charge of the power storage device.

Preferably, the current detection device includes a sensor that measures a current flowing through a wire connected to the power storage device, and a conversion unit that converts an output from the sensor in accordance with the ratio between the capacity of the power storage device and the reference capacity.

More preferably, when the capacity of the power storage device is n times as large as the reference capacity, the conversion unit multiplies the output from the sensor by 1/n, and then outputs a resultant.

Preferably, the vehicle includes a connection part that connects, to the power storage device, a power line for external charge.

Preferably, the vehicle includes a rotating electric machine that propels the vehicle with the use of power stored in the power storage device, and an internal combustion engine that propels the vehicle in cooperation with the rotating electric machine.

According to the present invention, it is possible to readily realize a hybrid vehicle applicable to various capacities of a secondary battery.

BRIEF DESCRIPTION OF THE DRAWINGS

FIG. 6 shows a state of control of a transistor at the time of charge.

BEST MODE FOR CARRYING OUT THE INVENTION

Figure 1:
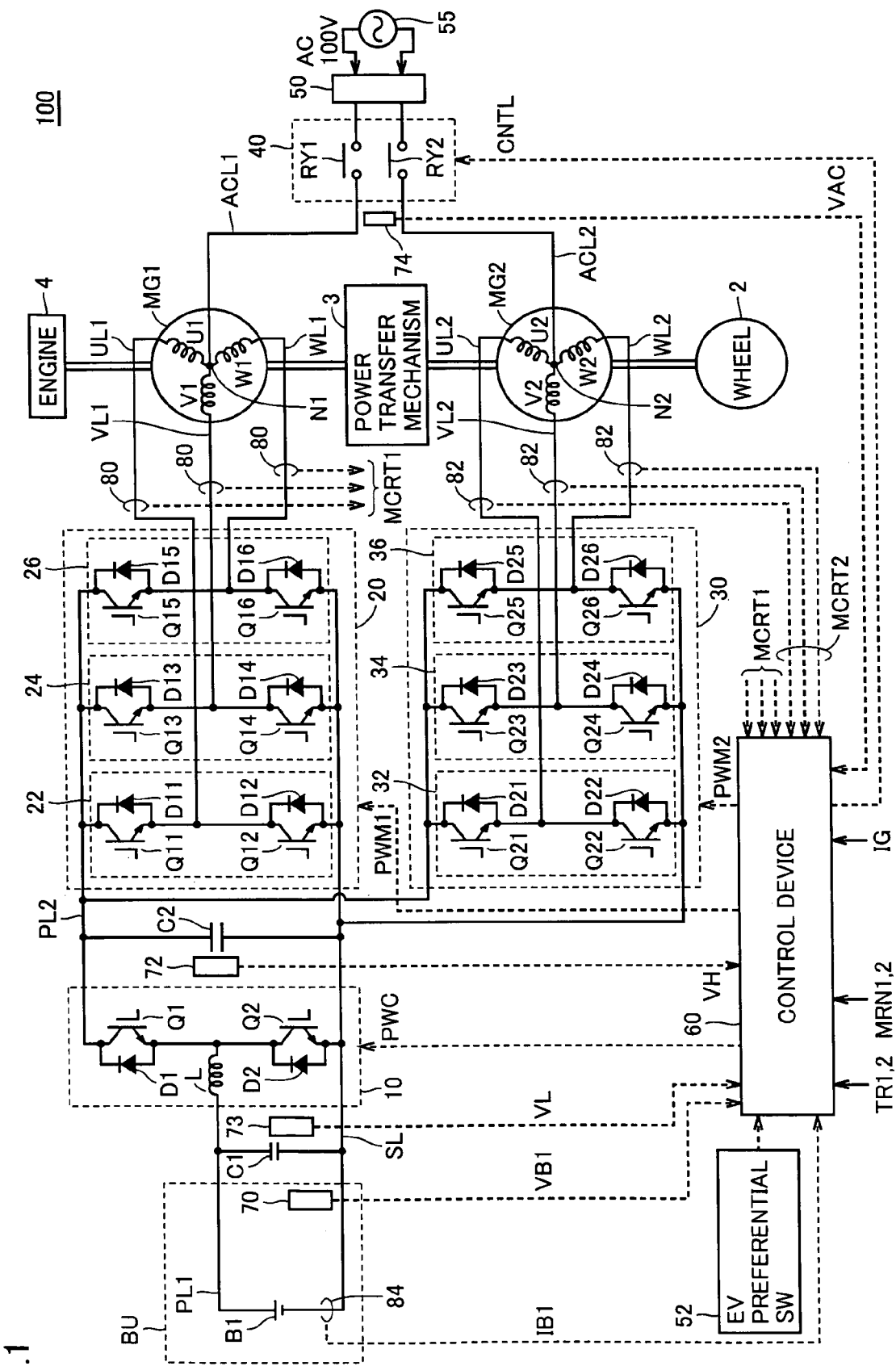
FIG. 1 is a schematic block diagram of a vehicle according to an embodiment of the present invention.

With reference to the drawings, hereinafter, detailed description will be given of an embodiment of the present invention. In the drawings, identical or corresponding portions are denoted by identical reference characters; therefore, description thereof will not be given repeatedly.

FIG. 1 is a schematic block diagram of a vehicle according to the embodiment of the present invention.

With reference to FIG. 1, vehicle 100 includes a battery unit BU, a voltage step-up converter 10, inverters 20 and 30, power supply lines PL1 and PL2, a grounding line SL, U-phase lines UL1 and UL2, V-phase lines VL1 and VL2, W-phase lines WL1 and WL2, motor generators MG1 and MG2, an engine 4, a power transfer mechanism 3, and wheels 2.

Vehicle 100 is a hybrid vehicle having a motor and an engine each used for driving wheels.

Power transfer mechanism 3 transfers power to engine 4, motor generator MG1 and motor generator MG2 each coupled thereto. For example, such a power transfer mechanism may be a planetary gear mechanism having three rotation shafts: a sun gear, a planetary carrier and a ring gear. The three rotation shafts are connected to a rotation shaft of engine 4, a rotation shaft of motor generator MG1 and a rotation shaft of motor generator MG2, respectively. For example, motor generator MG1 includes a hollow rotor, and a crank shaft of engine 4 is inserted into a center of the hollow rotor. Thus, engine 4, motor generator MG1 and motor generator MG2 can be mechanically connected to power transfer mechanism 3.

Herein, the rotation shaft of motor generator MG2 is coupled to wheel 2 through a decelerating gear or an operating gear (not shown). Further, a decelerator for the rotation shaft of motor generator MG2 may be incorporated into power transfer mechanism 3.

Herein, motor generator MG1 is incorporated into a hybrid vehicle so as to act as a generator driven by an engine and also act as a motor capable of starting up the engine. Motor generator MG2 is incorporated into the hybrid vehicle so as to act as a motor used for driving a driving wheel of the hybrid vehicle.

For example, each of motor generators MG1 and MG2 is a three-phase AC synchronous motor. Motor generator MG1 includes, as a stator coil, a three-phase coil consisting of a U-phase coil U1, a V-phase coil V1 and a W-phase coil W1. Motor generator MG2 includes, as a stator coil, a three-phase coil consisting of a U-phase coil U2, a V-phase coil V2 and a W-phase coil W2.

Herein, motor generator MG1 generates a three-phase AC voltage from output power from the engine, and outputs the generated three-phase AC voltage to inverter 20. Moreover, motor generator MG1 receives the three-phase AC voltage from inverter 20, generates a driving force from this three-phase AC voltage, and starts up the engine.

Motor generator MG2 receives a three-phase AC voltage from inverter 30 to generate torque used for driving the vehicle. At the time of regenerative braking of the vehicle, moreover, motor generator MG2 generates a three-phase AC voltage and outputs this three-phase AC voltage to inverter 30.

Battery unit BU includes a battery B1 that corresponds to a power storage device having a negative electrode connected to grounding line SL, a voltage sensor 70 that measures a voltage at battery B1, and a current sensor 84 that measures a current in battery B1. A vehicle load includes motor generators MG1 and MG2, inverters 20 and 30, and voltage step-up converter 10 that steps up a voltage and supplies a resultant voltage to each of inverters 20 and 30.

In battery unit BU, battery B1 is allowed to have a variously changeable power storage capacity. For example, battery B1 may be a secondary battery such as a nickel-metal hydride battery, a lithium ion battery or a lead storage battery. Moreover, a large-capacity electric double layer capacitor may be used in stead of battery B1.

Battery unit BU outputs, to voltage step-up converter 10, a DC voltage outputted from battery B1. Moreover, battery B1 in battery unit BU is charged by a DC voltage outputted from voltage step-up converter 10.

Voltage step-up converter 10 includes a reactor L, npn-type transistors Q1 and Q2, and diodes D1 and D2. Reactor L has a first end connected to power supply line PL1 and a second end connected to a node between npn-type transistors Q1 and Q2. Herein, npn-type transistors Q1 and Q2 are connected in series between power supply line PL2 and grounding line SL. Each of npn-type transistors Q1 and Q2 has a base receiving a signal PWC from a control device 60. Herein, diode D1 is connected between a collector and an emitter of npn-type transistor Q1 and diode D2 is connected between a collector and an emitter of npn-type transistor Q2 such that a current flows from each emitter toward each collector.

For example, an IGBT (Insulated Gate Bipolar Transistor) may be used as the npn-type transistor described above and an npn-type transistor to be described below in this specification. Moreover, a power switching element such as a power MOSFET (Metal Oxide Semiconductor Field-Effect Transistor) may be used in stead of the npn-type transistor.

Inverter 20 includes a U-phase arm 22, a V-phase arm 24 and a W-phase arm 26. U-phase arm 22, V-phase arm 24 and W-phase arm 26 are connected in parallel between power supply line PL2 and grounding line SL.

U-phase arm 22 includes npn-type transistors Q11 and Q12 connected in series, V-phase arm 24 includes npn-type transistors Q13 and Q14 connected in series, and W-phase arm 26 includes npn-type transistors Q15 and Q16 connected in series. A diode D11 is connected between a collector and an emitter of npn-type transistor Q11, a diode D12 is connected between a collector and an emitter of npn-type transistor Q12, a diode D13 is connected between a collector and an emitter of npn-type transistor Q13, a diode D14 is connected between a collector and an emitter of npn-type transistor Q14, a diode D15 is connected between a collector and an emitter of npn-type transistor Q15 and a diode D16 is connected between a collector and an emitter of npn-type transistor Q16 such that a current flows from each emitter toward each collector. A node between npn-type transistors Q11 and Q12 in U-phase arm 22 is connected, through U-phase line UL1, to a coil end different from a neutral point N1 of U-phase coil U1 of motor generator MG1, a node between npn-type transistors Q13 and Q14 in V-phase arm 24 is connected, through V-phase line VL1, to a coil end different from neutral point N1 of V-phase coil V1 of motor generator MG1, and a node between npn-type transistors Q15 and Q16 in W-phase arm 26 is connected, through W-phase line WL1, to a coil end different from neutral point N1 of W-phase coil W1 of motor generator MG1.

Inverter 30 includes a U-phase arm 32, a V-phase arm 34 and a W-phase arm 36. U-phase arm 32, V-phase arm 34 and W-phase arm 36 are connected in parallel between power supply line PL2 and grounding line SL.

U-phase arm 32 includes npn-type transistors Q21 and Q22 connected in series, V-phase arm 34 includes npn-type transistors Q23 and Q24 connected in series, and W-phase arm 36 includes npn-type transistors Q25 and Q26 connected in series. A diode D21 is connected between a collector and an emitter of npn-type transistor Q21, a diode D22 is connected between a collector and an emitter of npn-type transistor Q22, a diode D23 is connected between a collector and an emitter of npn-type transistor Q23, a diode D24 is connected between a collector and an emitter of npn-type transistor Q24, a diode D25 is connected between a collector and an emitter of npn-type transistor Q25 and a diode D26 is connected between a collector and an emitter of npn-type transistor Q26 such that a current flows from each emitter toward each collector. Also in inverter 30, a node between npn-type transistors Q21 and Q22 in U-phase arm 32 is connected, through U-phase line UL2, to a coil end different from a neutral point N2 of U-phase coil U2 of motor generator MG2, a node between npn-type transistors Q23 and Q24 in V-phase arm 34 is connected, through V-phase line VL2, to a coil end different from neutral point N2 of V-phase coil V2 of motor generator MG2, and a node between npn-type transistors Q25 and Q26 in W-phase arm 36 is connected, through W-phase line WL2, to a coil end different from neutral point N2 of W-phase coil W2 of motor generator MG2.

Vehicle 100 further includes capacitors C1 and C2, a relay circuit 40, a connector 50, an EV preferential switch 52, control device 60, AC lines ACL1 and ACL2, voltage sensors 72 to 74, and current sensors 80 and 82.

Capacitor C1 is connected between power supply line PL1 and grounding line SL, and reduces an influence which is caused by variations in voltage and is exerted on battery B1 and voltage step-up converter 10. Voltage sensor 73 measures a voltage VL between power supply line PL1 and grounding line SL.

Capacitor C2 is connected between power supply line PL2 and grounding line SL, and reduces an influence which is caused by variations in voltage and is exerted on inverter 20, inverter 30 and voltage step-up converter 10. Voltage sensor 72 measures a voltage VH between power supply line PL2 and grounding line SL.

Voltage step-up converter 10 steps up a DC voltage supplied from battery unit BU through power supply line PL1, and outputs a resultant DC voltage to power supply line PL2. More specifically, on the basis of signal PWC from control device 60, voltage step-up converter 10 stores, as magnetic field energy, a current flowing in accordance with a switching operation of npn-type transistor Q2, in reactor L, and then allows the current to flow into power supply line PL2 through diode D1 in synchronization with a timing that npn-type transistor Q2 is turned off, thereby releasing the stored energy. Thus, voltage step-up converter 10 steps up a voltage.

On the basis of signal PWC from control device 60, moreover, voltage step-up converter 10 receives a DC voltage(s) from any one of or both of inverters 20 and 30 through power supply line PL2, steps down the DC voltage(s) at a voltage level of battery unit BU, and charges the battery in battery unit BU.

On the basis of a signal PWM1 from control device 60, inverter 20 converts a DC voltage, which is supplied from power supply line PL2, to a three-phase AC voltage to drive motor generator MG1.

Thus, motor generator MG1 is driven to generate torque designated by a torque command value TR1. Moreover, inverter 20 converts a three-phase AC voltage, which is generated from motor generator MG1 by reception of output power from the engine, to a DC voltage on the basis of signal PWM1 from control device 60, and outputs the converted DC voltage to power supply line PL2.

On the basis of a signal PWM2 from control device 60, inverter 30 converts a DC voltage, which is supplied from power supply line PL2, to a three-phase AC voltage to drive motor generator MG2.

Thus, motor generator MG2 is driven to generate torque designated by a torque command value TR2. At the time of regenerative braking of the hybrid vehicle equipped with vehicle 100, moreover, inverter 30 converts a three-phase AC voltage, which is generated from motor generator MG2 by reception of a rotating force from a driving shaft, to a DC voltage on the basis of signal PWM2 from control device 60, and outputs the converted DC voltage to power supply line PL2.

Examples of the regenerative braking mentioned herein include: braking that involves regeneration in such a manner that a driver of a hybrid vehicle presses a foot brake; and deceleration (or stop of acceleration) that involves regeneration in such a manner that the driver does not press the foot brake, but turns off an accelerator pedal when the vehicle runs.

Relay circuit 40 includes relays RY1 and RY2. Each of relays RY1 and RY2 is a mechanical contact relay, for example, but may be a semiconductor relay. Relay RY1 is provided between AC line ACL1 and connector 50, and is turned on or off in accordance with a control signal CNTL from control device 60. Relay RY2 is provided between AC line ACL2 and connector 50, and is turned on or off in accordance with control signal CNTL from control device 60.

Relay circuit 40 connects or disconnects between each of AC lines ACL1 and ACL2 and connector 50 in accordance with control signal CNTL from control device 60. More specifically, relay circuit 40 receives control signal CNTL at H (logic high) level from control device 60 to electrically connect each of AC lines ACL1 and ACL2 to connector 50. On the other hand, relay circuit 40 receives control signal CNTL at L (logic low) level from control device 60 to electrically disconnect each of AC lines ACL1 and ACL2 from connector 50.

Connector 50 is a terminal for inputting an external AC voltage between neutral point N1 of motor generator MG1 and neutral point N2 of motor generator MG2. This AC voltage may be AC 100 V from a home-use commercial power line, for example. A voltage VAC between AC lines ACL1 and ACL2 is measured by voltage sensor 74, and the measured value is transmitted to control device 60.

Voltage sensor 70 detects a battery voltage VB1 of battery B1, and outputs detected battery voltage VB1 to control device 60. Voltage sensor 73 detects a voltage across capacitor C1, that is, an input voltage VL of voltage step-up converter 10, and outputs detected voltage VL to control device 60. Voltage sensor 72 detects a voltage across capacitor C2, that is, an output voltage VH of voltage step-up converter 10 (corresponding to input voltages of inverters 20 and 30, the same thing holds true in the following description), and outputs detected voltage VH to control device 60.

Current sensor 80 detects a motor current MCRT1 flowing through motor generator MG1, and outputs detected motor current MCRT1 to control device 60. Current sensor 82 detects a motor current MCRT2 flowing through motor generator MG2, and outputs detected motor current MCRT2 to control device 60.

On the basis of torque command values TR1 and TR2 as well as motor rotation speeds MRN1 and MRN2 of motor generators MG1 and MG2, each outputted from an external ECU (Electronic Control Unit), voltage VL outputted from voltage sensor 73, and voltage VH outputted from voltage sensor 72, control device 60 generates a signal PWC used for driving voltage step-up converter 10, and outputs generated signal PWC to voltage step-up converter 10.

On the basis of voltage VH, and motor current MCRT1 and torque command value TR1 of motor generator MG1, moreover, control device 60 generates a signal PWM1 for driving motor generator MG1, and outputs generated signal PWM1 to inverter 20. On the basis of voltage VH, and motor current MCRT2 and torque command value TR2 of motor generator MG2, further, control device 60 generates a signal PWM2 for driving motor generator MG2, and outputs generated signal PWM2 to inverter 30.

On the basis of a signal IG from an ignition switch (or an ignition key) and a SOC of battery B1, herein, control device 60 generates signals PWM1 and PWM2 for controlling inverters 20 and 30 such that battery B1 is charged with the use of an AC voltage for a commercial power supply applied between neutral point N1 of motor generator MG1 and neutral point N2 of motor generator MG2.

On the basis of the SOC of battery B1, further, control device 60 determines whether battery B1 is chargeable externally. If battery B1 is chargeable, control device 60 outputs control signal CNTL at H level to relay circuit 40. On the other hand, if battery B1 is charged almost fully and, therefore, is not chargeable, control device 60 outputs control signal CNTL at L level to relay circuit 40. If signal IG indicates a stop state, control device 60 stops inverters 20 and 30.

In accordance with a command given from a driver through EV preferential switch 52, control device 60 switches between a hybrid running mode premised on usual gasoline consumption, and an EV preferential running mode that preferentially uses battery power in such a manner that maximum torque is suppressed in comparison with that in the hybrid running mode and the vehicle is driven only by the motor.

Figure 2:
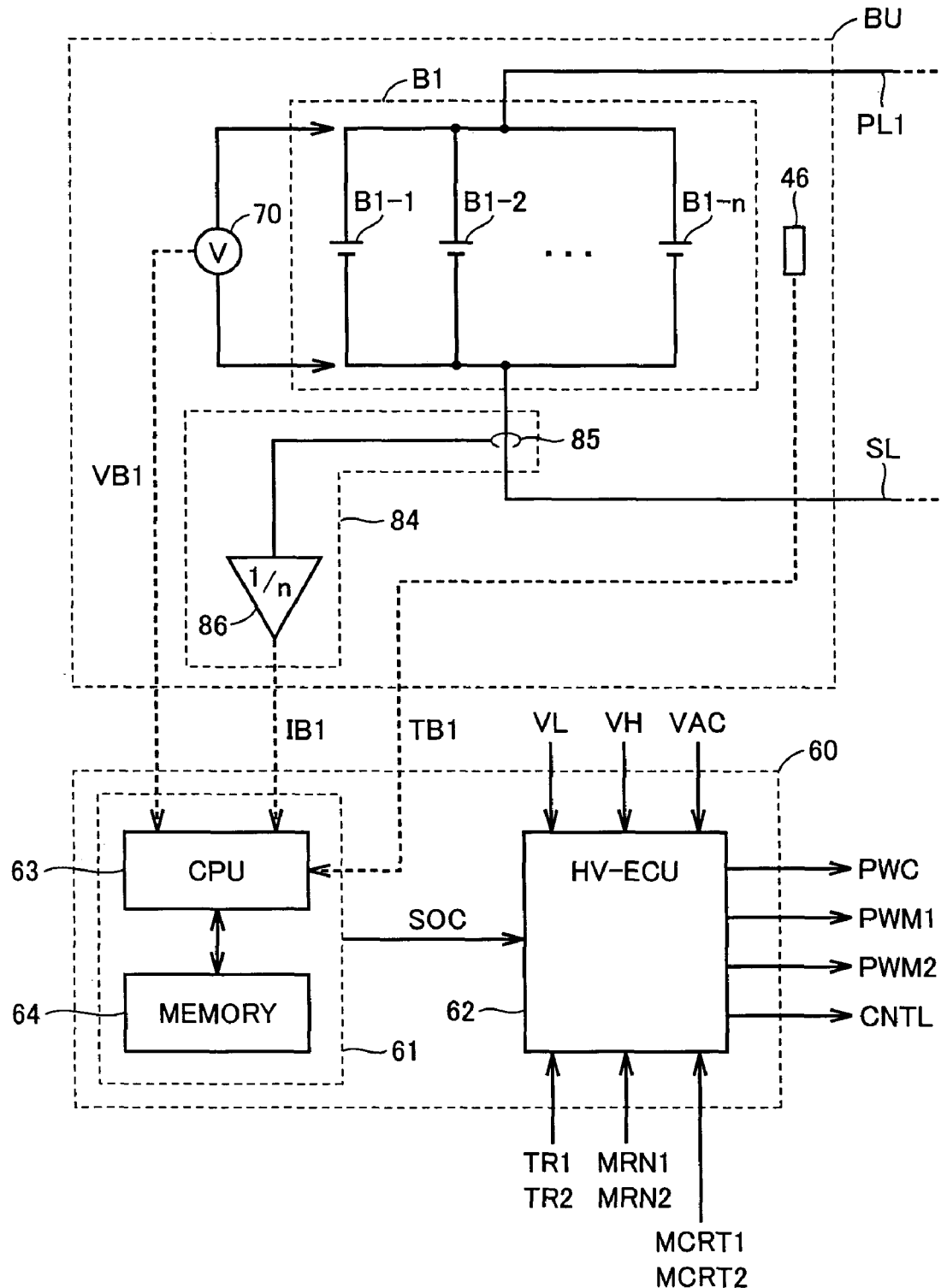
FIG. 2 shows more detailed configurations of a battery unit BU and a control device 60 each shown in FIG. 1.

FIG. 2 shows more detailed configurations of battery unit BU and control device 60 each shown in FIG. 1.

With reference to FIG. 2, battery unit BU includes battery B1 connected between power supply line PL1 and grounding line SL, voltage sensor 70 for measuring voltage VB1 of battery B1, and current sensor 84 for detecting a current inputted to/outputted from battery B1.

Battery B1 includes "n" unit batteries B1-1 to B1-n connected in parallel. Unit batteries B1-1 to B1-n are equal in capacitance value to each other. Accordingly, it is assumed herein that the capacitance value of one unit battery is defined as a reference capacitance value. If battery B1 includes "n" unit batteries, a capacitance value of battery B1 is n times as large as the reference capacitance value.

Current sensor 84 includes a sensor 85 for measuring a current flowing through grounding line SL connected to battery B1 serving as a power storage device, and a conversion unit 86 for converting an output from sensor 85 in accordance with a ratio between a capacity of battery B1 and a reference capacity. Specifically, if the capacitance value of battery B1 is n times as large as the reference capacitance value, conversion unit 86 converts the output from sensor 85 to a value corresponding to a 1/n current value, and outputs this value as a current value EB1.

Control device 60 includes a battery controlling ECU 61 and a hybrid system controlling HV-ECU 62. Battery controlling ECU 61 includes a CPU 63 and a memory 64. Although not shown in the figure, memory 64 may include a volatile random access memory (RAM), a read only memory (ROM) saving a program and a map, and a nonvolatile memory saving a program, a map, various measured values, various computed values and the like.

On the basis of battery voltage VB1, current IB1, and information about memory 64, battery controlling ECU 61 calculates a SOC of battery B1 and outputs the calculated SOC to HV-ECU 62. Battery controlling ECU 61 calculates a change amount of the SOC by a current integration adapted in a case where the capacity of battery B1 is equal to the reference capacity, and then calculates the SOC on the basis of this change amount.

HV-ECU 62 outputs control signals PWC, PWM1, PWM2 and CNTL on the basis of the SOC, voltages VL, VH and VAC, torque command values TR1, and TR2, motor rotation speeds MRN1 and MRN2, and motor current values MCRT1 and MCRT2.

That is, vehicle 100 includes battery B1 serving as the power storage device that has the capacity different from the reference capacity, current sensor 84 that detects the current inputted to/outputted from the power storage device, converts the detected value in accordance with the ratio between the capacity of the power storage device and the reference capacity, and outputs the resultant value, and control device 60 that is adapted in the case where the capacity of the power storage device is equal to the reference capacity, receives the output from the current detection unit to perform the current integration, and determines the state-of-charge of the power storage device. Preferably, current sensor 84 includes sensor 85 that measures the current flowing through the wire connected to the power storage device, and conversion unit 86 that converts the output from the sensor in accordance with the ratio between the capacity of the power storage device and the reference capacity. More preferably, when the capacity of the power storage device is n times as large as the reference capacity, conversion unit 86 multiplies the output from the sensor by 1/n, and then outputs the resultant output.

(Description about Calculation of SOC)

Figure 3:
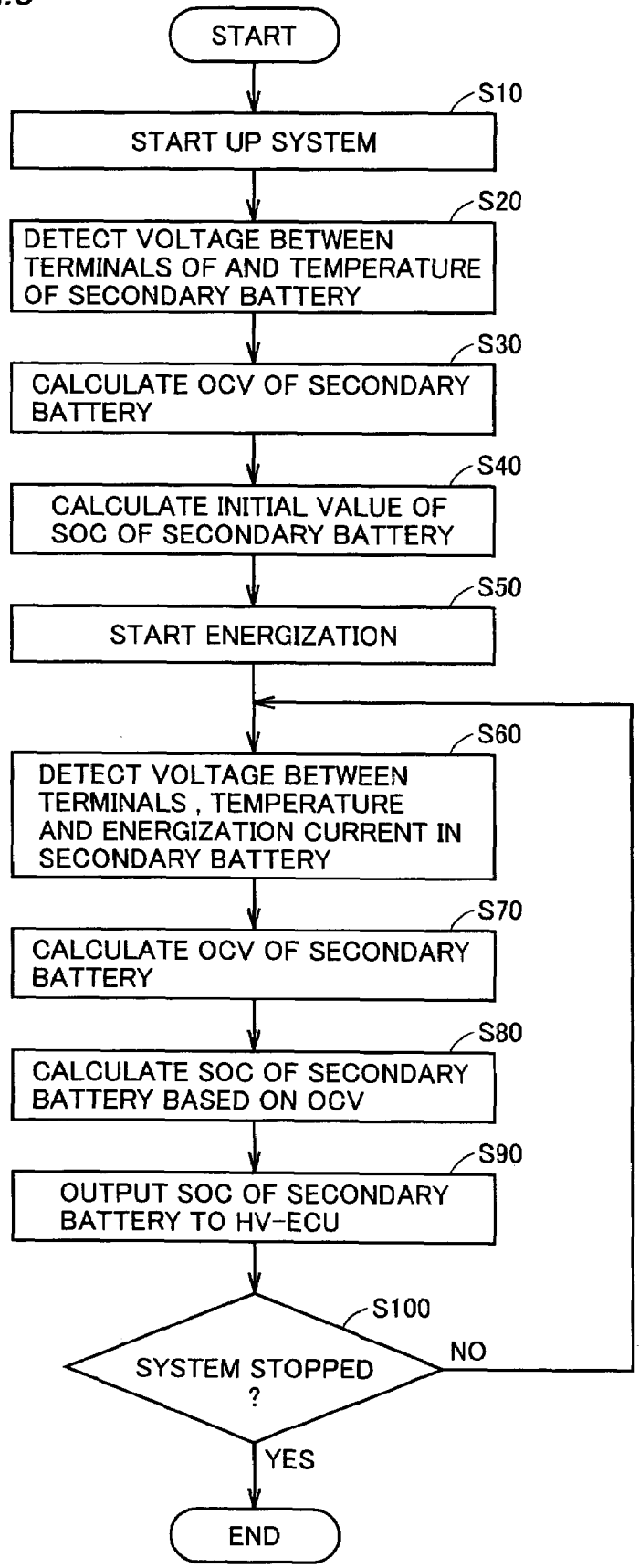
FIG. 3 is a flowchart showing a processing structure for calculation of a SOC of a battery B1 in a battery controlling ECU 61 shown in FIG. 2.

FIG. 3 is a flowchart showing a processing structure for calculation of the SOC of battery B1 in battery controlling ECU 61 shown in FIG. 2.

With reference to FIG. 3, when this hybrid system is started up (step S10), voltage sensor 70 detects voltage VB1 between the terminals of battery B1 and outputs detected voltage VB1 to ECU 61, and a temperature sensor 46 detects a temperature TB1 of battery B1 and outputs detected temperature TB1 to ECU 61 (step S20).

CPU 63 of ECU 61 receives voltage VB1 and temperature TB1 to calculate an open circuit voltage (hereinafter, also referred to as an "OCV") of battery B1 on the basis of voltage VB1 (step S30). Next, CPU 63 reads, from memory 64, a map or a model equation indicating a correlation between the OCV and the SOC of battery B1, and then calculates an initial value of the SOC of the battery B1 with the use of the read map or model equation, on the basis of the calculated OCV of battery B1 and detected temperature TB1 of battery B1 (step S40).

As a method of estimating a SOC of a secondary battery, there is typically known a method of detecting a voltage between terminals of the secondary battery, estimating an OCV of the secondary battery from the detected voltage, and estimating the SOC of the secondary battery on the basis of the estimated OCV.

Figure 4:
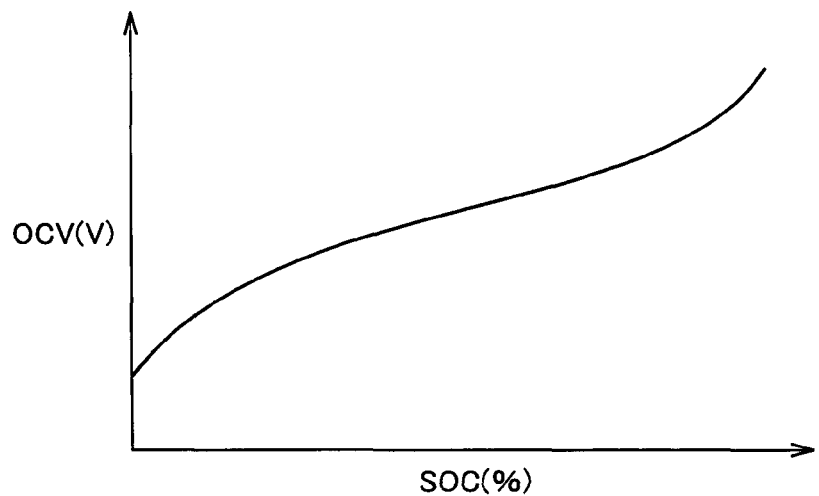
FIG. 4 shows a correlation between an OCV and a SOC of battery B1 shown in FIG. 1.

FIG. 4 shows the correlation between the OCV and the SOC of battery B1 shown in FIG. 1.

With reference to FIG. 4, the correlation between the OCV and the SOC of battery B1 has the following features. That is, there is no linear relation between the OCV and the SOC, and a gradient of a curve is gentle except a portion in the vicinity of an upper limit of the SOC and a portion in the vicinity of a lower limit of the SOC.

For example, such a correlation is stored as a map in memory 64, so that the SOC corresponding to the initial OCV can be obtained from the map. More preferably, a three-dimensional map is prepared in such a manner that temperature TB1 is converted to a variable.

The initial value of the SOC obtained as described above is also used for obtaining the SOC of battery B1 which is being subjected to charge/discharge. Herein, battery B1 has a large voltage drop amount at the time of energization; therefore, a current value must be monitored as will be described below in order to obtain the SOC at the time of charge/discharge.

With reference to FIG. 3 again, when the initial value of the SOC of battery B1 is calculated in step S40, the processing proceeds to step S50.

In step S50, the charge/discharge for the secondary battery is started. In step S60, next, voltage sensor 70, temperature sensor 46 and current sensor 85 detect voltage VB1 between the terminals of, temperature TB1 of and current IB1 in battery B1, respectively, and output detected voltage VB1, temperature TB1 and current IB1 to ECU 61, respectively.

Upon reception of voltage VB1, temperature TB1 and current IB1, CPU 63 calculates a voltage drop amount VR of battery B1 on the basis of temperature TB1 and current IB1, and subtracts calculated voltage drop amount VR from voltage VB1 to calculate the OCV of battery B1 (step S70). More preferably, herein, an amount VDYN of voltage drop due to polarization in battery B1 is corrected in accordance with an energization time.

Next, CPU 63 calculates the SOC of battery B1 again with the use of the map or model equation indicating the correlation between the OCV and the SOC of battery B1, on the basis of the calculated OCV of battery B1 and detected temperature TB1 of battery B1 (step S80).

In step S90, next, CPU 63 outputs the calculated SOC of battery B1 to HV-ECU 62.

Thereafter, CPU 63 determines whether to receive an external command about a stop of this hybrid system (step S100). If CPU 63 receives no command about the stop of the system (NO in step S100), the processing returns to step S60. On the other hand, if CPU 63 receives this external command about the stop of the system (YES in step S100), a sequence of the processing ends.

Herein, a SOC calculated at the time of previous completion of the system is stored in a nonvolatile memory and an initial value of the SOC may be calculated in step S40 on the basis of this stored SOC.

Battery controlling ECU 61 calculates a SOC in a range from 0% to 100% by a current integration, for example. It is assumed herein that the SOC of the battery having the capacity equal to the reference capacity is calculated in a range from 0% to 100%. When the battery having the capacity which is N times as large as the reference capacity is used so as to be simply connected to battery controlling ECU 61, 1/N of an original change amount of the SOC is calculated. In order to control the vehicle, HV-ECU 62 does not uses the value obtained from the current integration, but uses the value of the SOC which is calculated by battery controlling ECU 61 and is expressed by a percentage in a range from 0% to 100%. Consequently, if the battery to be connected has the capacity which is N times as large as the reference capacity, the capacity that can be used in actual is only 1/N of the reference capacity.

That is, even when the capacity of the battery is N times as large as the reference capacity, battery controlling ECU 61 can not recognize this fact and, consequently, can not utilize the increased capacity of the battery. The present embodiment can avoid such a problem.

In a case where conversion unit 86 is not provided in FIG. 2, a function of calculating a SOC by a current integration must be changed in software of ECU 61 each time a vehicle equipped with battery B1 having a changed capacity is developed. If such a change is neglected, the following disadvantage may occur. That is, even when the capacity of battery B1 is changed to that which is three times as large as the reference capacity, ECU 61 still recognizes that the capacity of battery B1 is equal to the reference capacity. Consequently, when a predetermined amount of current is drawn, ECU 61 erroneously determines that battery B1 must be charged. Hence, even when the capacity of battery B1 is made large, the engine is started up immediately in order to charge battery B1. Consequently, the power stored in battery B1 can not be utilized fully.

In contrast, the embodiment of the present invention brings the following advantages. That is, in a case where the number of unit batteries shown in FIG. 2 is changed, the software for battery controlling ECU 61 to be prepared commonly is adapted to the reference capacity. By conversion of only the variable of conversion unit 86, battery controlling ECU 61 can calculate the SOC without problems in all probability. Therefore, the hybrid system is readily developed for various vehicle types without increasing man-hours for development of the software for battery controlling ECU 61.

It is to be noted that FIG. 2 shows battery B1 having a configuration that batteries each having a capacity equal to the reference capacity are connected in parallel in order to increase the capacity and a coefficient of conversion unit 86 is changed in correspondence with a capacity ratio, for the sake of facilitation of understanding. However, the configuration of battery B1 is not limited to this configuration. Alternatively, one battery may have a large capacity. Moreover, there is no necessity that conversion unit 86 is provided independently of sensor 85. It is sufficient that conversion unit 86 has a characteristic of outputting, as a current value, a value corresponding to 1/n in comparison with a current sensor to be used in a case where the capacity of battery B1 is equal to the reference capacity.

(Description about External Charge)

Next, description will be given of a method of generating an DC charging voltage from AC voltage VAC for a commercial power supply in vehicle 100.

Figure 5:
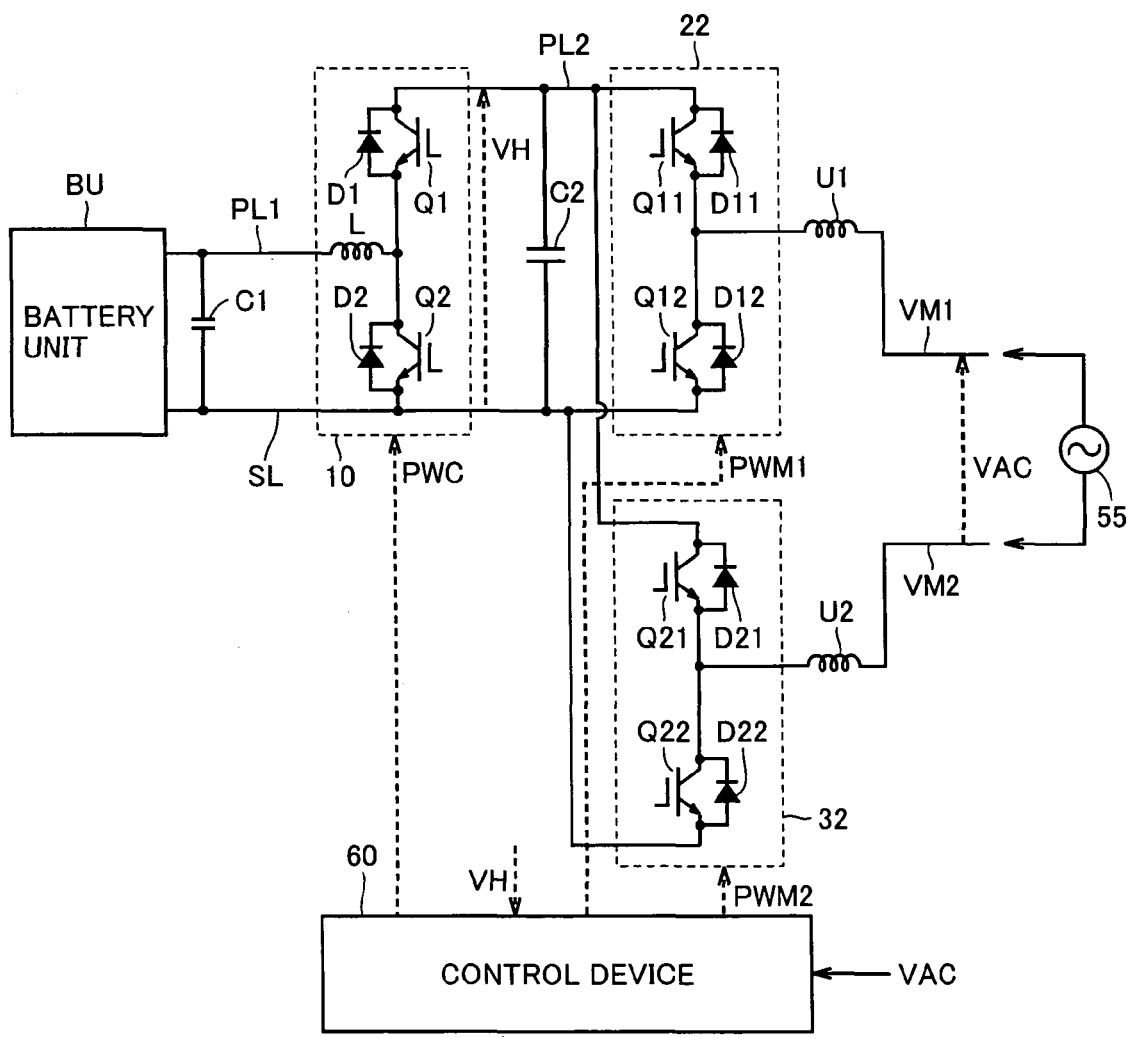
FIG. 5 shows a portion for charge in the circuit diagram of FIG. 1 in a simplified manner.

FIG. 5 shows a portion for charge in the circuit diagram of FIG. 1 in a simplified manner.

FIG. 5 representatively shows the U-phase arms of inverters 20 and 30 shown in FIG. 1. Moreover, FIG. 5 representatively shows the U-phase coil in the three-phase coil of the motor generator. Herein, representative description will be given of the U phase. Since a current of an identical phase flows through each of the U-phase coil, the V-phase coil and the W-phase coil, a V-phase circuit and a W-phase circuit operate as in a U-phase circuit. As will be apparent from FIG. 5, a set of U-phase coil U1 and U-phase arm 22 and a set of U-phase coil U2 and U-phase arm 32 are similar in configuration to voltage step-up converter 10. Accordingly, an AC voltage of 100 V can be converted to a DC voltage. Furthermore, the converted DC voltage can be converted to a battery charging voltage of about 200 V by a voltage step-up operation.

FIG. 6 shows a state of control of a transistor at the time of charge.

With reference to FIGS. 5 and 6, in a case of voltage VAC>0, that is, in a case where a voltage VM1 at line ACL1 is higher than a voltage VM2 at line ACL2, transistor Q1 is set at an ON state and transistor Q2 is set at an OFF state in the voltage step-up converter. Thus, voltage step-up converter 10 allows a charging current to flow from power supply line PL2 toward power supply line PL1.

In the first inverter, next, transistor Q12 is subjected to switching at a cycle and a duty ratio each corresponding to voltage VAC, and transistor Q11 is set at an OFF state or a switching state in which transistor Q11 is energized in synchronization with energization of diode D11. In the second inverter, on the other hand, transistor Q21 is set at an OFF state and transistor Q22 is set at an ON state.

In the case of voltage VAC>0, a current flows through coil U1, transistor Q12, diode D22 and coil U2 successively in an ON state of transistor Q12. Herein, the energy stored in coils U1 and U2 is discharged when transistor Q12 is set at an OFF state, and the current flows into power supply line PL2 via diode D11. In order to reduce the loss in diode D11, transistor Q11 may be energized in synchronization with an energization period of diode D11. On the basis of values of voltages VAC and VH, a voltage step-up ratio is obtained, and a switching cycle and a duty ratio of transistor Q12 are determined.

Next, in a case of voltage VAC<0, that is, in a case where voltage VM1 at line ACL1 is lower than voltage VM2 of line ACL2, transistor Q1 is set at an ON state and transistor Q2 is set at an OFF state in the voltage step-up converter. Thus, voltage step-up converter 10 allows a charging current to flow from power supply line PL2 toward power supply line PL1.

In the second inverter, next, transistor Q22 is subjected to switching at a cycle and a duty ratio each corresponding to voltage VAC, and transistor Q21 is set at an OFF state or a switching state in which transistor Q21 is energized in synchronization with energization of diode D21. In the first inverter, on the other hand, transistor Q11 is set at an OFF state and transistor Q12 is set at an ON state.

In the case of voltage VAC<0, a current flows through coil U2, transistor Q22, diode D12 and coil U1 successively in an ON state of transistor Q22. Herein, the energy stored in coils U1 and U2 is discharged when transistor Q22 is set at an OFF state, and the current flows into power supply line PL2 via diode D21. In order to reduce the loss in diode D21, transistor Q21 may be energized in synchronization with an energization period of diode D21. Also in this case, on the basis of the values of voltages VAC and VH, a voltage step-up ratio is obtained, and a switching cycle and a duty ratio of transistor Q22 are determined.

Figure 7:
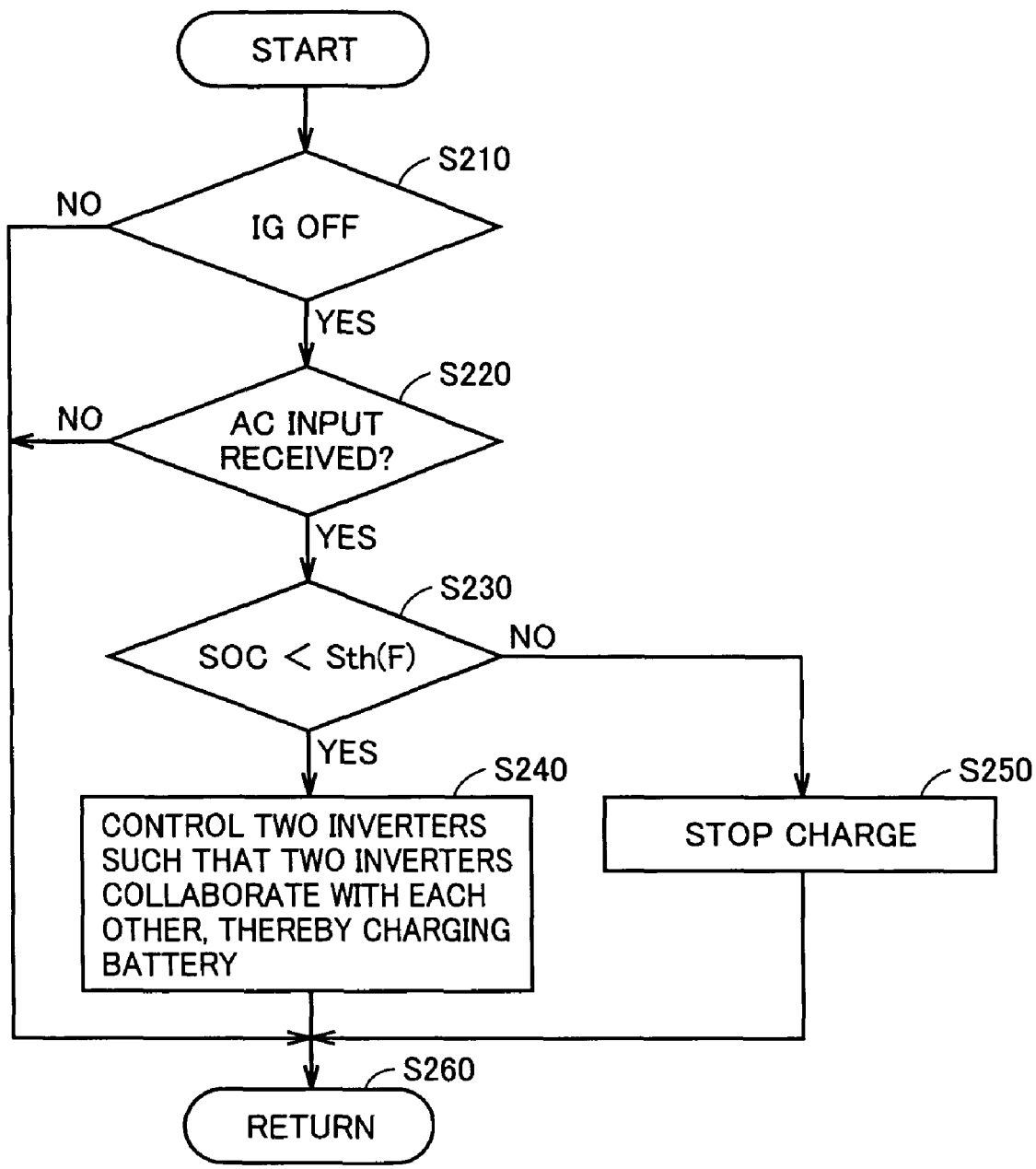
FIG. 7 is a flowchart showing a control structure for a program regarding determination of a start of charge performed by control device 60 shown in FIG. 1.

FIG. 7 is a flowchart showing a control structure for a program regarding determination of a start of charge performed by control device 60 shown in FIG. 1. Processing in this flowchart is executed while being called from a main routine every certain time interval or each time a predetermined condition is established.

With reference to FIGS. 1 and 7, first, in step S210, control device 60 determines whether a signal IG is set at an OFF state. If signal IG is not set at the OFF state in step S210, it is unsuitable to charge the battery in such a manner that a charging cable is connected to the vehicle. Then, the processing proceeds to step S260, and the control is transferred to the main routine.

If signal IG is set at the OFF state in step S210, it is suitable to charge the battery. Then, the processing proceeds to step S220. In step S220, relays RY1 and RY2 are controlled so as to be changed from a non-energization state to an energization state, and voltage sensor 74 measures voltage VAC. In a case where no AC voltage is monitored, it is considered that the charging cable is not connected to a socket of connector 50; therefore, the charging operation is not performed. Then, the processing proceeds to step S260, and the control is transferred to the main routine.

In step S220, on the other hand, when the AC voltage is monitored as voltage VAC, the processing proceeds to step S230. In step S230, control device 60 determines whether the SOC of battery B1 is smaller than a threshold value Sth (F) indicating a state of full charge.

If a relation SOC<Sth (F) is established, the battery is in a chargeable state; therefore, the processing proceeds to step S240. In step S240, control device 60 controls the two inverters such that the inverters collaborate with each other, thereby charging battery B1.

If the relation SOC<Sth (F) is not established in step S230, battery B1 is in a state of full charge and, therefore, has no necessity of charge. Then, the processing proceeds to step S250. In step S250, a charge stop operation is performed. Specifically, inverters 20 and 30 are stopped and relays RY1 and RY2 are opened, so that input of AC power to vehicle 100 is blocked. Then, the processing proceeds to step S260, and the control is returned to the main routine.

With regard to such a chargeable hybrid vehicle, likewise, the embodiment of the present invention brings the following advantages. That is, in the case where the number of unit batteries shown in FIG. 2 is changed, by conversion of the variable of conversion unit 86, ECU 61 can calculate the SOC without problems in all probability. Therefore, the hybrid system is readily developed for various vehicle types without increasing man-hours for development of the software for ECU 61.

It should be understood that the embodiment disclosed herein is in all aspects illustrative and not restrictive. Since the scope of the present invention is defined by the appended claims rather than by the foregoing description, and all changes that fall within metes and bounds of the claims, or equivalence of such metes and bounds thereof are intended to be embraced by the claims.

The invention claimed is:

1. A vehicle comprising:
    a power storage unit, said power storage unit including
        a power storage device that has a capacity different from a reference capacity, and
        a current detection unit that detects a current inputted to/outputted from said power storage device, converts the detected value in accordance with a ratio between the capacity of said power storage device and said reference capacity, and outputs a resultant; and
    a charge control device that receives the output from said current detection unit, performs a current integration, and determines a state-of-charge of said power storage device; wherein
    said charge control device is not included in said power storage unit, and
    said current detection unit includes
        a sensor that measures a current flowing through a wire connected to said power storage device, and
        a conversion unit that converts an output from said sensor in accordance with the ratio between the capacity of said power storage device and said reference capacity.

2. The vehicle according to claim 1, wherein when the capacity of said power storage device is n times as large as said reference capacity, said conversion unit multiplies the output from said sensor by 1/n, and then outputs a resultant.

3. The vehicle according to claim 1, further comprising:
    a connection part that connects, to said power storage device, a power line for external charge.

4. The vehicle according to claim 1, further comprising:
    a rotating electric machine that propels said vehicle with the use of power stored in said power storage device; and
    an internal combustion engine that propels said vehicle in cooperation with said rotating electric machine.

5. A power supply device of a vehicle, comprising:
    a power storage unit, said power storage unit including
    a power storage device that has a capacity different from a reference capacity; and
    a current detection unit that detects a current inputted to/outputted from said power storage device, converts the detected value in accordance with a ratio between the capacity of said power storage device and said reference capacity, and outputs a resultant, wherein
        said current detection unit outputs said detected value to a charge control device that performs a current integration and determines, a state-of-charge of said power storage device,
        said charge control device is not included in said power storage unit, and
        said current detection unit includes
        a sensor that measures a current flowing through a wire connected to said power storage device, and
        a conversion unit that converts an output from said sensor in accordance with the ratio between the capacity of said power storage device and said reference capacity.

6. The power supply device according to claim 5, wherein when the capacity of said power storage device is n times as large as said reference capacity, said conversion unit multiplies the output from said sensor by 1/n, and then outputs a resultant.

7. The power supply device according to claim 5, further comprising:
    a connection part that connects, to said power storage device, a power line for external charge.

8. The power supply device according to claim 5, wherein said vehicle includes:
    a rotating electric machine that propels said vehicle with the use of power stored in said power storage device; and
    an internal combustion engine that propels said vehicle in cooperation with said rotating electric machine.

9. A current detection device for use in a power supply device of a vehicle,
    said current detection device being connected between a power storage device that has a capacity different from a reference capacity and a charge control device,
    said current detection device being configured to detect a current inputted to/outputted from said power storage device, to convert the detected value in accordance with a ratio between the capacity of said power storage device and said reference capacity and to output a resultant, wherein
        said charge control device performs a current integration and determines a state-of-charge of said power storage device,
        said current detection device and said power storage device are included in a power storage unit,
        said charge control device is not included in said power storage unit, and
        said current detection device comprises
            a sensor that measures a current flowing through a wire connected to said power storage device; and
            a conversion unit that converts an output from said sensor in accordance with the ratio between the capacity of said power storage device and said reference capacity.

10. The current detection device according to claim 9, wherein
    when the capacity of said power storage device is n times as large as said reference capacity, said conversion unit multiplies the output from said sensor by 1/n, and then outputs a resultant.

11. The current detection device according to claim 9, wherein
    said vehicle includes a connection part that connects, to said power storage device, a power line for external charge.

12. The current detection device according to claim 9, wherein
    said vehicle includes:
    a rotating electric machine that propels said vehicle with the use of power stored in said power storage device; and
    an internal combustion engine that propels said vehicle in cooperation with said rotating electric machine.

13. The vehicle according to claim 1, wherein the reference capacity corresponds to a capacity of a unit battery, and the capacity of the power storage device corresponds to a capacity of a plurality of unit batteries.

* * * * *